(12) United States Patent
Kao

(10) Patent No.: US 6,194,232 B1
(45) Date of Patent: Feb. 27, 2001

(54) MULTI-TRACK WAFER PROCESSING METHOD

(75) Inventor: Te-Yin Kao, Hsinchu (TW)

(73) Assignees: ProMos Technology, Inc,; Mosel Vitelic Inc, both of Hsinchu (TW); Siemens AG, Munich (DE)

(*) Notice: Subject to any disclaimer, the term of this patent is extended or adjusted under 35 U.S.C. 154(b) by 0 days.

(21) Appl. No.: 09/128,982

(22) Filed: Aug. 3, 1998

(51) Int. Cl.[7] ............................ G01R 31/26; H01L 21/66
(52) U.S. Cl. ............................ 438/14; 438/907; 438/908
(58) Field of Search .................................. 438/907, 908, 438/14; 29/25.01; 700/101, 111

(56) References Cited

U.S. PATENT DOCUMENTS

| | | | |
|---|---|---|---|
| 5,024,570 | * 6/1991 | Kiriseko et al. | 414/222.06 |
| 5,402,350 | * 3/1995 | Kline | 700/101 |
| 5,855,681 | * 1/1999 | Maydan et al. | 118/719 |
| 5,928,389 | * 7/1999 | Jevtic | 29/25.01 |

* cited by examiner

Primary Examiner—Richard Booth
Assistant Examiner—Walter L. Lindsay, Jr.
(74) Attorney, Agent, or Firm—W. Wayne Liauh

(57) ABSTRACT

A wafer processing method is provided for processing a plurality of wafer lots concurrently in a plurality of different tanks. Each wafer lot is assigned a specific start number, position number, tank number and wafer number. Upon a wafer completing a process in a tank, a finish signal is generated, and a next wafer lot information for a wafer lot that needs the completed tank for processing is loaded into a memory. Once the tank is free and available, the next wafer from a wafer lot is moved in while all other tanks are being processed independently and concurrently. The wafer lots do not need to queue in sequence for other wafer lots to complete processing in different tanks. Total processing time can therefore be reduced and through-put increased.

11 Claims, 5 Drawing Sheets

| wafer lot | 1 | 2 | 3 |
|---|---|---|---|
| lot seguence | 2 | 3 | 5 |
| stage number | 10 | 20 | 30 |
| tank number | 11 | 12 | 13 |
| wafer number | 3 | 8 | 15 |

FIG.5

MULTI-TRACK WAFER PROCESSING METHOD

BACKGROUND OF THE INVENTION

1. Field of the Invention

This invention relates to a wafer processing method that offers concurrent processing of a plural number of wafer lots in different wafer tanks for reducing the total processing time and increasing through-put.

2. Description of the Prior Art

Conventional methods for processing semi-conductor wafers use sequencing by lots. In other words, one lot of wafers has to complete a processing step in one tank before another lot of wafers may be processed in another tank. FIG. 1 shows such an example. There are three lots 1, 2 and 3 of wafers that are stored and assigned respectively at three different stages 10, 20 and 30. There are four different tanks 11, 12 13 and 14. Each tank may perform a different wafer process such as depositing photo resist, etching processing, etc. There is a passage 15 for communicating the stages with each tank. For instance, lot 1 may be assigned a process sequence number 21 and be processed in the tank 11, lot 2 be assigned a sequence number 22 for processing in the tank 12, and lot 3 be assigned a sequence number 23 to be processed in the tank 13.

The problem with the conventional methods is that all the lots to be processed must be sequenced one after another. For example, lot 2 cannot be transported to the tank 12 until after the lot 1 at the tank 11 has completed its processing thereof. Lot 3 cannot be moved to the tank 13 until after lot 1 and lot 2 have completed processing in tanks 11 and 12. Therefore, the queue time is long and adversely affects total through-put.

FIG. 2 further explains the process flow of a conventional sequenced wafer lot processing method. Step 411 is to load different lots of wafers to different stages. Step 412 selects a required processing recipe (such as depositing photoresistance or etching the wafer) for each lot and starting execution of the processing. Step 413 is to set the processing priority for each lot, including assigning the starting sequence number, position number and tank number, etc. Step 414 involves scanning the wafer in a wafer lot to read the lot information. Step 415 involves loading the lot information into a computer memory buffer. In step 416, the wafer from a fixed lot to be processed is loaded into a specific tank. Step 417 performs one wafer processing such as depositing photoresistance on the wafer. Step 418 involves moving the wafer to its original location (original lot). At step 419, there are two possible routes. If this is not the last wafer in the lot, then processing returns to the step 415 for processing the next wafer.

If it is the last wafer in the lot, then step 420 further checks if it is the last lot. If the answer is negative, processing returns again to step 415 for another cycle of processing through the step 421. If the answer is positive, then processing ends at step 422.

The conventional processing method set forth above is basically a sequential operation. Each lot will be assigned a sequence number (step 413). Once assigned, it will be waiting in a queue until a preceding lot has completed processing even if it takes a different processing step at a different tank.

SUMMARY OF THE INVENTION

In view of aforesaid disadvantages, it is therefore an object of this invention to provide a wafer processing method that can perform multiple processings for a plurality of wafer lots concurrently at different tanks. Total processing time is thus greatly shortened while processing facilities can be more efficiently used, and total productivity can therefore be greatly increased.

The method according to this invention generates a FINISH signal at the end of wafer processing in a tank. Once the FINISH signal is detected and the tank number is known, the sequence information of the next wafer lot which will use that tank is loaded into the memory so that the next wafer lot may be transported to that tank once the finished lot has been moved out of that tank. The processing of the wafer lots thus may be dynamically assigned and independently performed, so that a plurality of wafer lots may be processed at different tanks concurrently. Total processing time thus may be greatly reduced.

The method of this invention may be used with various processing steps such as depositing photoresistance, wafer etching and others. Each wafer lot will be assigned with a starting sequence number, position number, tank number and wafer serial number.

BRIEF DESCRIPTION OF THE DRAWINGS

The invention, as well as its many advantages, may be further understood by the following detailed description and drawings in which:

FIG. 5 is an example illustrating how wafer lot sequence numbers are assigned according to the present invention.

DETAILED DESCRIPTION OF THE PREFERRED EMBODIMENT

Figure 3:
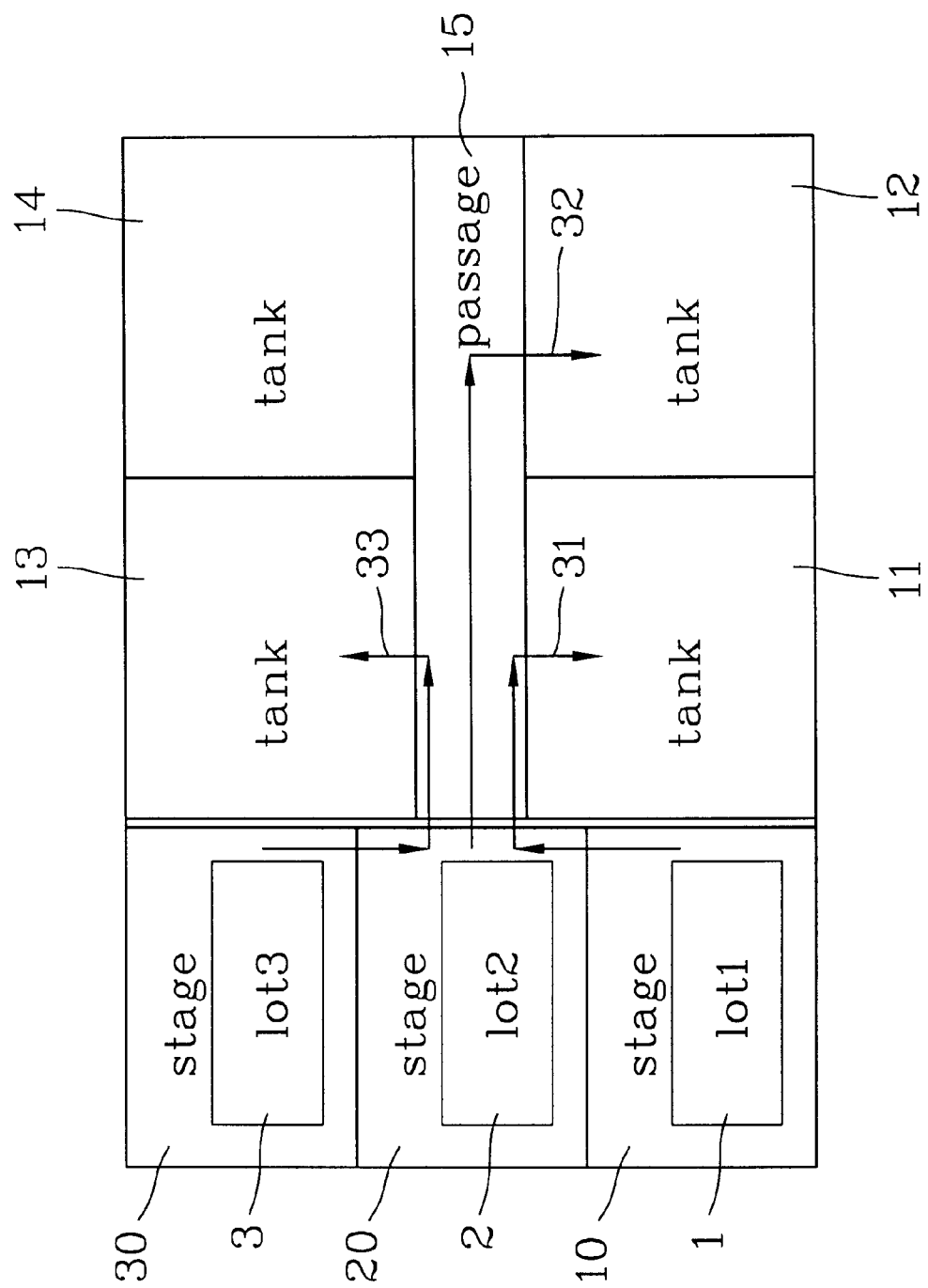
FIG. 3 is a schematic view of a wafer lot processing method according to the present invention.

The present invention is to provide a wafer processing method that can perform multiple processing for a plurality of wafer lots concurrently at different tanks. The FIG. 3 illustrates an example of a general arrangement of the present invention. There are three wafer lots 1, 2 and 3 that are placed and assigned respectively at three different stages 10, 20 and 30. There are four different tanks 11, 12, 13 and 14. Each tank may perform a different wafer processing step such as depositing photo resist, etching, etc. There is a passage 15 for communicating the stages with each tank. Instead of having the three wafer lots in a queue at the stages and being routed to an assigned tank for processing in sequence, the present invention assigns each wafer lot with a different track number for routing to a targeting tank (e.g., 31 for wafer lot 1, 32 for wafer lot 2 and 33 for wafer lot 3). All three lots 1, 2, and 3 may be concurrently transported via the passage 15 to three different tanks for concurrent processing. Each wafer lot may be handled and processed independently without waiting for other lots to complete their respective processing.

Figure 4:
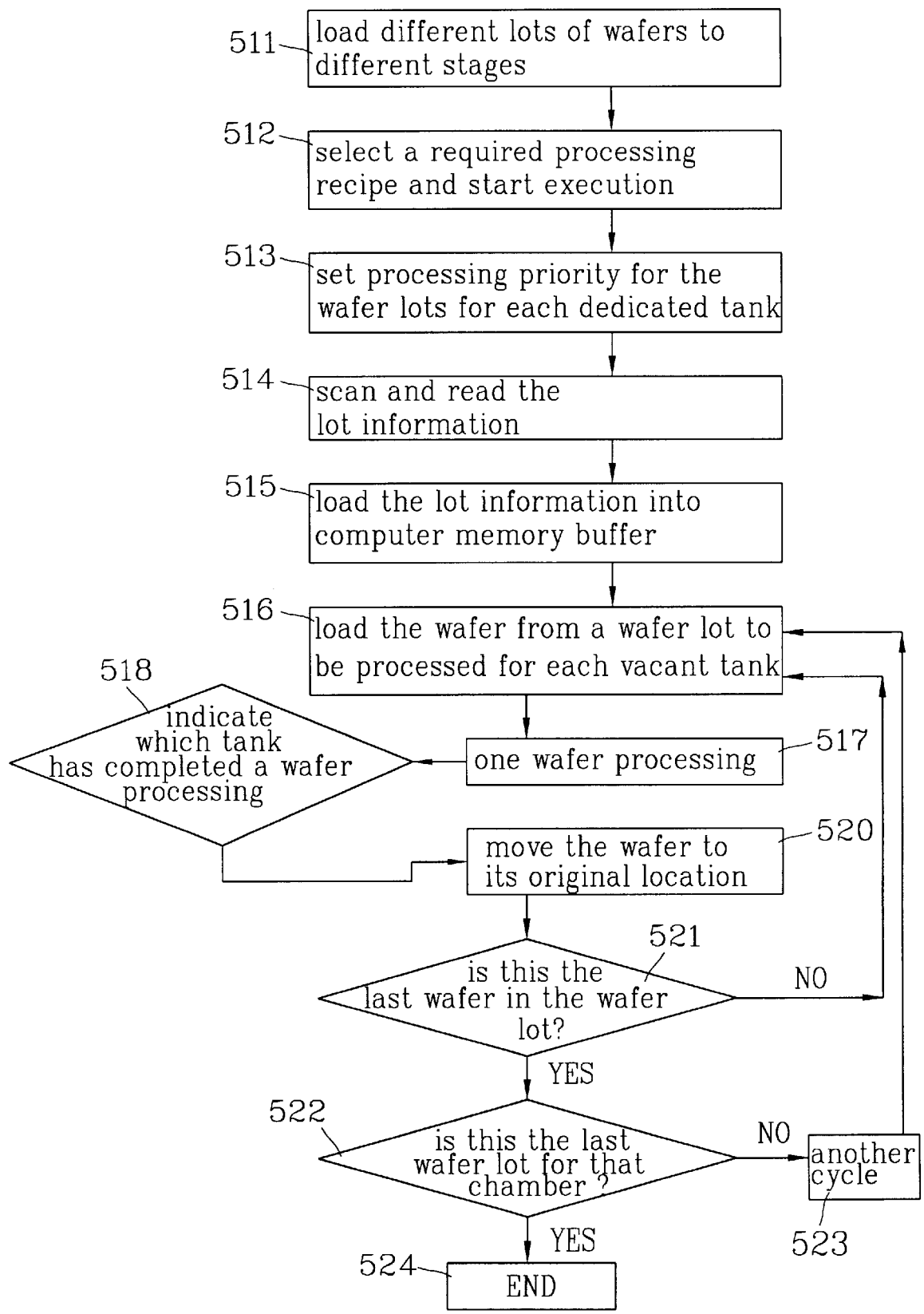
FIG. 4 is a flow chart of the method of FIG. 3.

FIG. 4 shows the process flow of the present invention. Steps 511 through 516 are substantially the same as the steps 411 through 416 of the conventional method shown in FIG. 2. Except that the term "lot" be changed into "wafer lot", and the step 416 means the wafer from a fixed lot is different from step 516. The step 416 means the wafer from a wafer lot which is not fixed, for example, the wafer processed in tank 11 is form wafer lot 1 in this time, the next wafer processed in tank 11 may be from wafer lot 2 in next time. The procedure of the wafer lot is preset in the lot information. The step 512, selects a required processing recipe is such as depositing photo resist or etching the wafer for each wafer in the wafer lot.

However, after processing of a specific wafer from a wafer lot is completed at step 517, the present invention generates a FINISH signal at step 518 to indicate which tank has completed a wafer processing and will be available for processing another wafer from a wafer lot. At step 519, the next wafer lot information that can use the vacant tank is loaded into the memory (such as wafer number, tank number, position number, etc.) for next processing cycle.

Figure 1:
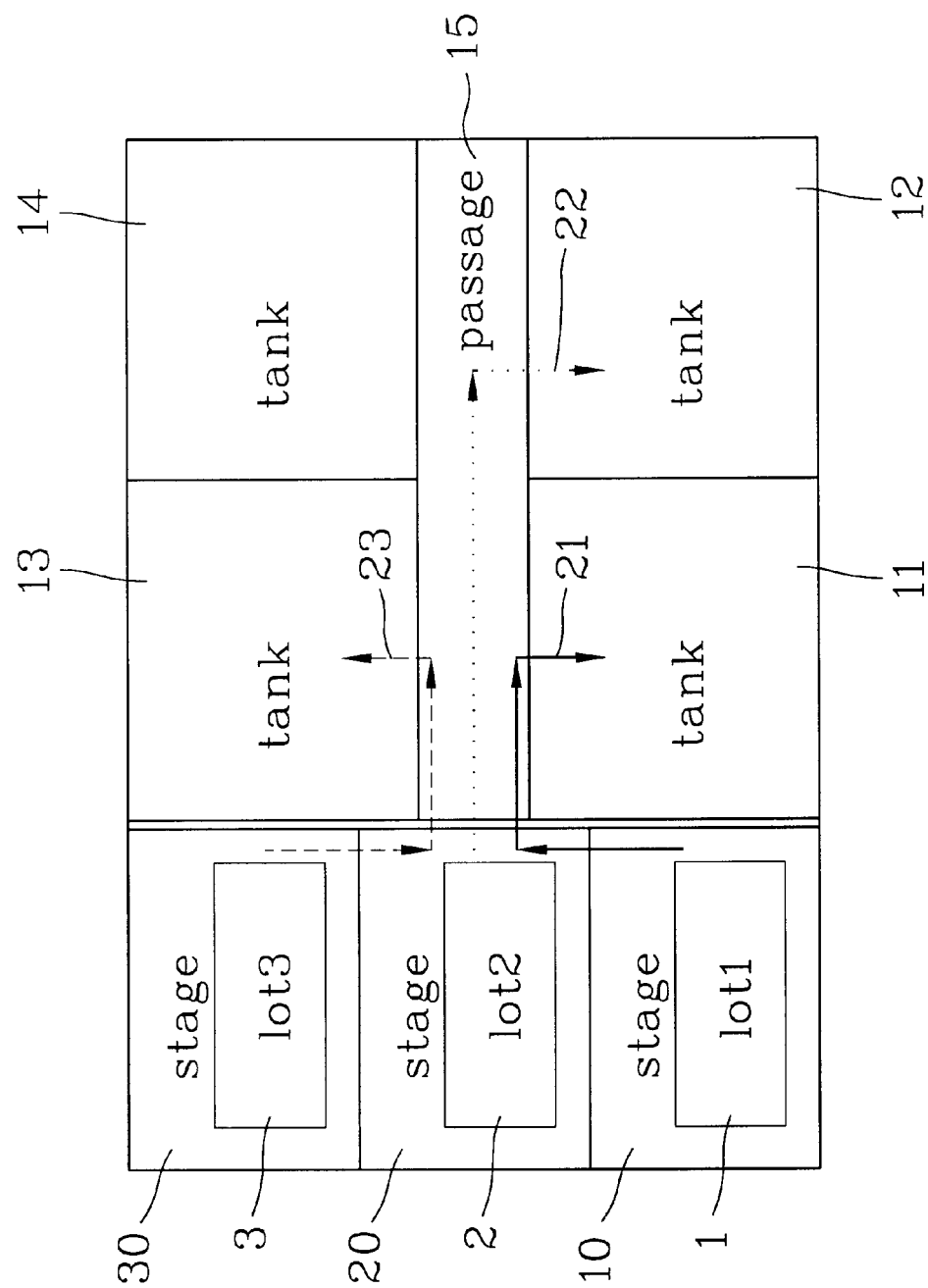
FIG. 1 is a schematic view of a conventional wafer lot processing method.
Figure 2:
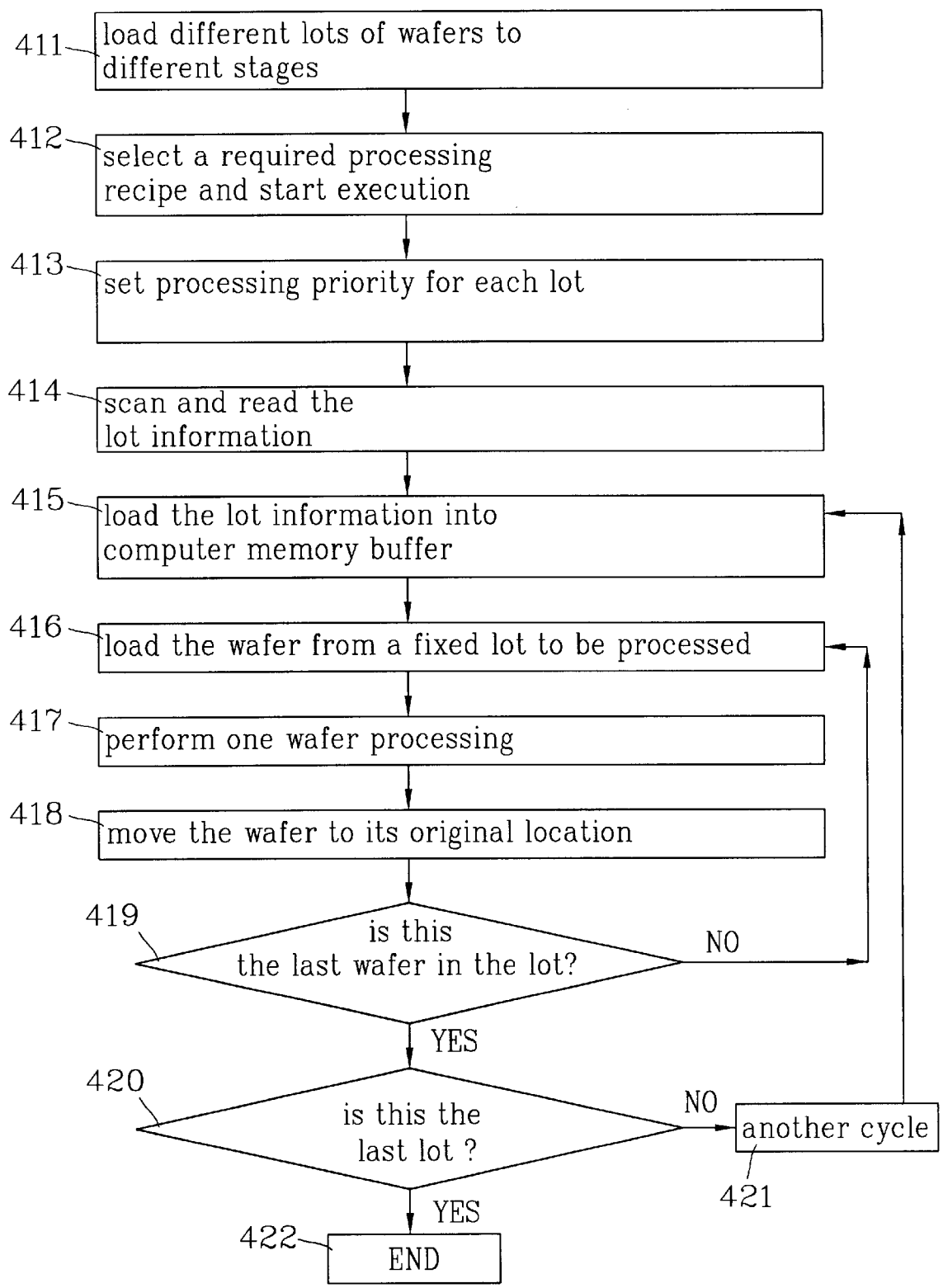
FIG. 2 is a flow chart of the conventional wafer lot processing method.

Steps 520 through 524 are substantially the same as the steps 418 through 422 for the conventional processing method shown in FIG. 2. Except that the term "lot" be changed into "wafer lot". So the details of these steps will be not be repeated here.

FIG. 5 illustrates how the wafer lot sequence numbers of this invention are assigned. Each wafer lot 1, 2, 3 has respectively an assigned starting number A1, A2, A3, position number B1, B2, B3, tank number C1, C2, C3 and wafer number D1, D2, D3. In the conventional method, once the numbers have been assigned, all processing sequences are set and fixed, therefore each wafer lot has to be queued for sequential processing one after the other. That is why total processing time is increased and the tanks are not being effectively used. In the present invention, a FINISH signal is generated after each wafer has completed a processing step, so that the finished wafer may be handled and transported independently without waiting for other wafers that are still being processed. Thus, the next wafer from the next wafer lot may be transported to the finished and vacant tank for processing while all other tanks are still processing the other wafer from other wafer lots. Therefore the processing procedures become much more flexible and productive.

In this invention, the main operation described about, should be emphasized that one tank processing one wafer. When one tank is empty, a robot take one wafer from one specific wafer lot to transmit into the empty tank. The wafer lot information includes starting number, position number, tank number and wafer number are needed and saved into a computer memory buffer. By the wafer lot information, the procedure of taking one wafer from the specific wafer lot will be defined. The procedure and the wafer lot information will be stored and be controlled by a computer. Further, in FIG. 4, the step 520 use the lot information from step 515 through a robot controlled by a computer. The FINISH signal produced after the step 518 is generated by the computer. The step 519 also enables by the computer, i.e., the procedure of the next wafer lot information is loaded into the memory (step 519) is done by the computer firmware. The step 515 will receive the wafer lot information from step 519 to execute the next wafer.

As mentioned above, in the step 515, the sequence number of the lot information is the basis for scanning of the wafer to be processed. The sequence number includes the tank number and the position number for determining processing priority of the wafer. In the step 516, load the wafer to be processed includes transporting the wafer being assigned a sequence number to a designated tank for processing by a robot. In step 519, load the next wafer lot information processing number into the memory buffer includes assigning tank number and position number in the processing number for determining processing priority of the next wafer. In the step 520, move the finished wafer back to its original location includes moving the processed wafer back to its original position according to its original processing number. When the result of the step 521 is NO, the next wafer will be processed, and which is based on a position number of the wafer.

A computer and a robot are used in this invention, but they are also used in the prior art, we will not describe it in detailed. All the controlling procedure in this invention can be done by a firmware. The storing and controlling of the computer technique is not the main disclosed in the specification, so we will not describe it in detailed.

It may thus be seen that the objects of the present invention set forth herein, as well as those made apparent from the foregoing description, are efficiently attained. While the preferred embodiment of the invention has been set forth for purpose of disclosure, modifications of the disclosed embodiment of the invention as well as other embodiments thereof may occur to those skilled in the art. Accordingly, the appended claims are intended to cover all embodiments which do not depart from the spirit and scope of the invention.

What is claimed is:

1. A wafer processing method, comprising the steps of:
   providing a plurality of wafer processing tanks;
   assigning a wafer lot number and a tank number to a group of said wafers; and
   loading a wafer from each wafer lot into a tank according to its assigned tank number, such that wafers of different wafer lot numbers are processed in different tanks concurrently.

2. The wafer processing method of claim 1, wherein each tank generates a finish signal when completing processing of a wafer so that a next wafer which will use the tank will be sequenced after said finish signal is detected.

3. The wafer processing method of claim 1, wherein the processing is depositing photoresistance on the wafer.

4. The wafer processing method of claim 1, wherein the processing is etching the wafer.

5. The wafer processing method of claim 1 further including the steps of:
   loading each wafer of the wafer lots to a different stage;
   selecting a processing recipe and starting execution for each wafer lot;
   setting wafer processing priority;
   scanning and reading the wafer lot information;
   before the step of loading the wafer to be processed into a tank, loading a wafer lot sequence number into a memory buffer;
   processing the wafer and generating a finish signal when processing has been completed; determining the tank number and the location that generated the finish signal;
   loading a next wafer from a wafer lot processing number into the memory buffer;
   moving the finished wafer back to its original location; and processing the next wafer.

6. The wafer processing method of claim 5, wherein the sequence number is the basis for scanning of the wafer to be processed.

7. The wafer processing method of claim 5, wherein the sequence number includes the tank number and the position number for determining processing priority of the wafer.

8. The wafer processing method of claim 5, wherein the step of loading the wafer to be processed includes transporting the wafer being assigned a sequence number to a designated tank for processing.

9. The wafer processing method of claim 5, wherein the step of loading a next wafer lot processing number into the memory buffer includes assigning tank number and position number in the processing number for determining processing priority of the next wafer.

10. The wafer processing method of claim 5, wherein the step of moving the finished wafer back to its original location includes moving the processed wafer back to its original position according to its original processing number.

11. The wafer processing method of claim 5, wherein the step of processing the next wafer is based on a position number of the wafer.

* * * * *